(12) United States Patent
Klaba

(10) Patent No.: US 9,497,892 B2
(45) Date of Patent: Nov. 15, 2016

(54) CHIMNEY SHAPED DATA CENTER

(75) Inventor: Henryk Klaba, Roubaix (FR)

(73) Assignee: OVH SAS, Roubaix (FR)

( * ) Notice: Subject to any disclaimer, the term of this patent is extended or adjusted under 35 U.S.C. 154(b) by 0 days.

(21) Appl. No.: 14/238,894

(22) PCT Filed: Aug. 20, 2012

(86) PCT No.: PCT/FR2012/051913
§ 371 (c)(1),
(2), (4) Date: Jul. 2, 2014

(87) PCT Pub. No.: WO2013/026985
PCT Pub. Date: Feb. 28, 2013

(65) Prior Publication Data
US 2014/0331582 A1    Nov. 13, 2014

(30) Foreign Application Priority Data

Aug. 19, 2011 (FR) ...................................... 11/57424

(51) Int. Cl.
*H05K 7/14* (2006.01)
*H05K 7/20* (2006.01)

(52) U.S. Cl.
CPC ........ *H05K 7/20745* (2013.01); *H05K 7/1497* (2013.01)

(58) Field of Classification Search
CPC ........... H05K 7/1497; H05K 7/20745; H05K 7/20136; E04H 5/02
USPC ....................... 52/1, 79.1, 234, 302.1, 302.3; 361/679.46, 679.48, 679.5, 695, 690
See application file for complete search history.

(56) References Cited

U.S. PATENT DOCUMENTS

| | | | |
|---|---|---|---|
| 6,225,705 B1 * | 5/2001 | Nakamats | F03D 9/002 290/1 R |
| 7,278,273 B1 | 10/2007 | Whitted et al. | |
| 7,508,663 B2 * | 3/2009 | Coglitore | 361/695 |
| 7,658,039 B2 * | 2/2010 | Ziegelman | E04B 1/3483 52/18 |
| 7,961,463 B2 * | 6/2011 | Belady et al. | 361/695 |
| 8,151,537 B2 * | 4/2012 | Pope | E04B 1/3431 52/67 |
| 8,844,220 B2 * | 9/2014 | Boersema | F24F 11/0001 52/198 |
| 8,931,227 B2 * | 1/2015 | Keane | E04F 15/02038 52/309.4 |
| 2005/0168945 A1 * | 8/2005 | Coglitore | H05K 7/20736 361/695 |
| 2009/0229194 A1 | 9/2009 | Armillas | |
| 2009/0251860 A1 | 10/2009 | Belady et al. | |
| 2010/0251629 A1 | 10/2010 | Clidaras et al. | |
| 2011/0138708 A1 * | 6/2011 | Chazelle | E04H 1/06 52/173.1 |
| 2014/0141707 A1 * | 5/2014 | Carlson et al. | 454/184 |
| 2014/0259966 A1 * | 9/2014 | Totani et al. | 52/1 |

FOREIGN PATENT DOCUMENTS

EP    2 354 378 A1    8/2011

OTHER PUBLICATIONS

International Search Report of PCT/FR2012/051913, dated Dec. 18, 2012.

* cited by examiner

*Primary Examiner* — Rodney Mintz
*Assistant Examiner* — Daniel Kenny
(74) *Attorney, Agent, or Firm* — Sughrue Mion, PLLC

(57) ABSTRACT

Technical infrastructure (1) for data centers, comprising a plurality of computer rooms (2), characterized in that the rooms (2) are arranged in the shape of a chimney, the cavity (5) of which is open upwards.

16 Claims, 1 Drawing Sheet

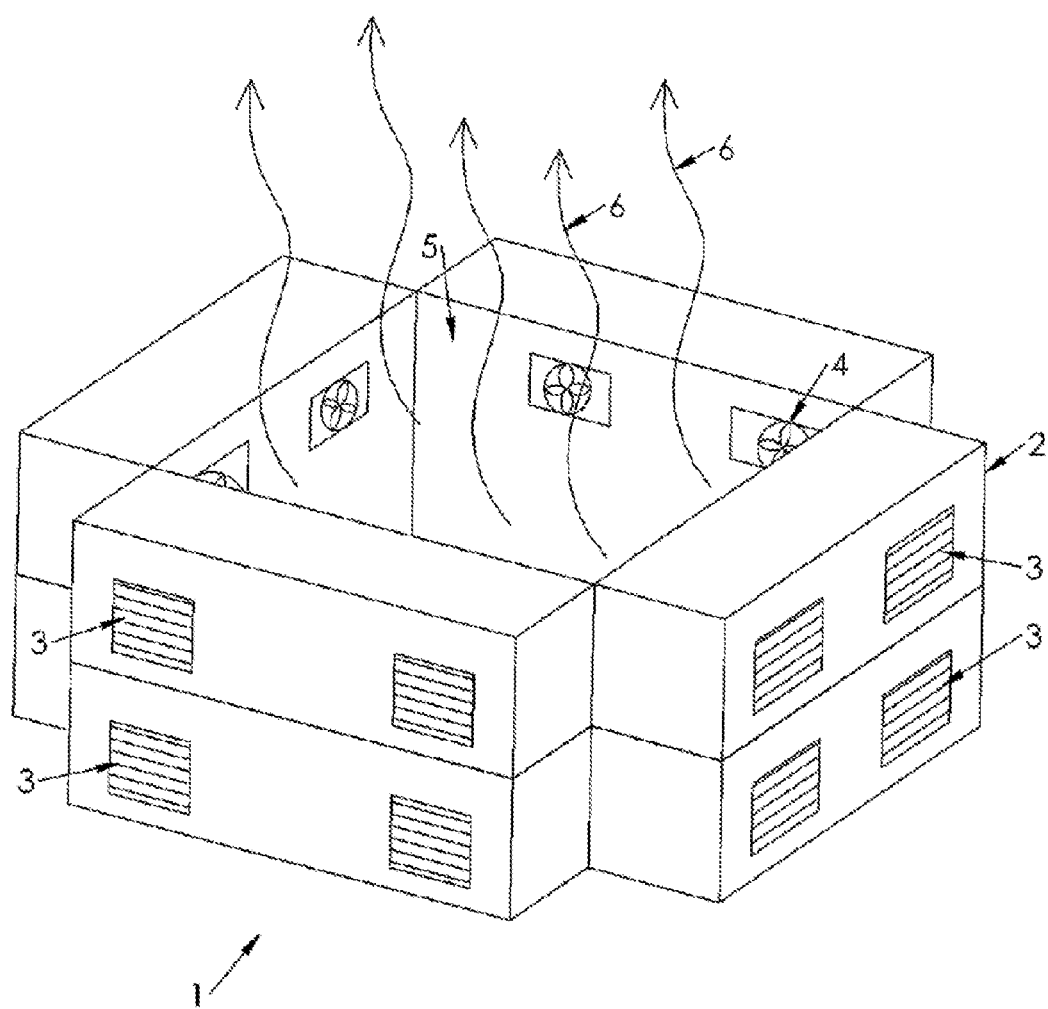

CHIMNEY SHAPED DATA CENTER

CROSS REFERENCE TO RELATED APPLICATIONS

This application is a National Stage of International Application No. PCT/FR2012/051913 filed Aug. 20, 2012, claiming priority based on French Patent Application No. 11/57424, filed Aug. 19, 2011, the contents of all which are incorporated herein by reference in their entirety.

The present invention concerns the architecture of technical infrastructures, and more particularly the energy optimization thereof.

"Technical infrastructure" is understood here as being any capital infrastructure dedicated to information and communication technologies, such as a computing/data center, hosting center, backup site, or a telecom/carrier hotel, or server farm.

These infrastructures are generally in the form of large computer rooms (or buildings) comprising, by way of non-exhaustive examples, telecommunications equipment, servers, storage systems, power supply systems, cooling systems, inverters, electricity distribution systems, and workstations.

In order to maintain the hygrometry and temperature within recommended ranges in these infrastructures, cooling systems and methods are arranged there.

However, with the accelerated deployment of new uses (multimedia, Internet of Things, cloud computing, for example), these infrastructures house more and more energy-hungry equipment, resulting in pushing the cooling systems to their limits, and consequently the energy efficiency of these infrastructures is being reduced.

The known architectures of technical infrastructures further alter the energy efficiency of said architectures. Indeed, these architectures are generally arranged as buildings designed to preserve heat, and not to dissipate it.

The stacking of tiers of computer equipment, with no consideration for the overall morphology of the infrastructure, results in excess energy consumption, particularly by the cooling and air-handling systems.

An object of the present invention is to overcome the limitations of the prior art.

Another object of the present invention is to propose a technical infrastructure architecture (an arrangement) enabling heat to be evacuated.

Another object of the present [invention] is to improve the energy efficiency of a technical infrastructure.

Another object of the present invention is to design energy-efficient data centers.

Another object of the present invention is to reduce or limit the energy consumption of the physical infrastructures (for example, air-handling system, cooling system) of a technical infrastructure.

Another object of the present invention is to integrate the architectural dimension in order to reduce the energy consumption of a technical infrastructure.

Another object of the present invention is to improve the performance of a technical infrastructure and to reduce its ecological footprint.

Another object of the present invention is to reduce the costs related to cooling a technical infrastructure.

To that end, according to a first aspect the invention relates to a technical infrastructure of data centers comprising a plurality of computer rooms arranged in the shape of a chimney, the cavity of which is open upwards, said technical infrastructure further comprising a plurality of ventilators arranged in the sides facing said cavity, each ventilator being arranged to move the air from the interior of the technical infrastructure towards the cavity.

According to one embodiment, each computer room of the technical infrastructure comprises at least one ventilator facing the cavity and at least one opening facing one side of the technical infrastructure.

Advantageously, the vertical cavity resulting from the chimney shape of the technical infrastructure enables the hot air in the interior of the technical infrastructure to be evacuated to the exterior by the chimney effect (thermal draught).

Other characteristics and advantages of the invention will appear more clearly and in more detail from the following description of preferred embodiments, provided with reference to FIG. 1, which diagrammatically illustrates a view in perspective of a technical infrastructure arranged according to the present invention.

The following description is with reference to a data center. Of course, this example of a technical infrastructure is not limiting and can relate to any other capital infrastructure dedicated to information and communication technologies.

Represented in FIG. 1 is a data center 1 that can have more than one function, such as a backup site, a hosting center for a plurality of enterprises, or an interconnection center for a plurality of operators.

The data center 1, composed of a plurality of computer rooms (or blocks) 2, is arranged in the shape of a chimney. The data center 1 thus constitutes a hollow building having a cavity 5 that is open upwards.

Ventilators 4, arranged in the sides facing the cavity 5 of the data center 1, enable the hot air to be moved towards the cavity 5, which in turn evacuates it towards the exterior by the chimney effect. The chimney effect is due to the difference in temperature between the hot air inside the data center 1 and the cool air of the exterior, which causes a rising displacement 6 of air coming from the ventilators 4.

Advantageously, the combination of the chimney effect produced by the cavity 5 and the force of the wind at the intake of the wall openings 3, made in the sides of the data center 1, provides a natural ventilation of the data center 1. In other words, the air is naturally moved through the computer rooms 2 of the data center 1. Indeed, the air that flows through the wall openings 3 towards the interior of the data center 1 goes back out, via the ventilators 4, by thermal draught towards the cavity 5.

As a variation, the ventilation can be artificially produced by the ventilators 4 acting in this case as exhaust fans.

Preferably, the cavity 5 is a convex polygon, particularly rectangular or square. As a variation, the cavity 5 is a concave or crossed polygon.

Preferably, each computer room 2 comprises at least one ventilator 4 facing the cavity 5 and at least one opening 3 facing one side of the infrastructure 1.

Preferably, the computer rooms 2 (or blocks 2) are substantially identical. In one embodiment, the computer rooms 2 are parallelepipeds.

The chimney-shaped arrangement of the data center just described has a number of advantages. Indeed, it makes it possible to improve the energy efficiency of the technical infrastructure by reducing the energy consumed to power and cool a server, for example, compared to its own consumption;

to limit the harmful impact on the environment by reducing energy consumption;

to extract naturally, by thermal draught (chimney effect), the hot air from the interior of the data center;

to improve the cooling of the interior of the data center by controlling the air flow.

The invention claimed is:

1. A technical infrastructure for data centers, comprising a plurality of computer rooms arranged in the shape of a chimney, thereby forming a hollow building having a cavity that is open upwards, said technical infrastructure further comprises a plurality of fans arranged in one or more sides facing said cavity, each ventilator fan arranged to move the air from the interior of the technical infrastructure towards the cavity, and comprises at least one wall opening arranged to allow air to enter the interior of the technical infrastructure and, wherein, along an upward length of the chimney, the chimney cavity has a uniform cross-sectional area taken in a horizontal plane along a length of the cavity.

2. The technical infrastructure according to claim 1, characterized in that each room comprises one ventilator fan facing the cavity and one opening facing one side of the technical infrastructure.

3. The technical infrastructure according to claim 1, characterized in that the rooms are substantially identical.

4. The technical infrastructure according to claim 1, characterized in that the rooms are parallelepipeds.

5. A data center comprising an infrastructure as defined in claim 1.

6. The technical infrastructure according to claim 1, wherein the uniform cross-sectional area is a polygon.

7. The technical infrastructure according to claim 1, wherein the uniform cross-sectional area is a convex polygon.

8. The technical infrastructure according to claim 1, wherein the uniform cross-sectional area is a rectangle or square.

9. The technical infrastructure according to claim 1, wherein the uniform cross-sectional area is a concave polygon.

10. The technical infrastructure according to claim 1, wherein the technical infrastructure is capital infrastructure dedicated to information and communication technologies.

11. The technical infrastructure according to claim 1, wherein the technical infrastructure is capital infrastructure dedicated to and containing a computing/data center, hosting center, data backup site, a telecom/carrier hotel, or server farm.

12. The technical infrastructure according to claim 1, wherein the chimney is unobstructed at a top of the building.

13. An infrastructure for data centers, comprising a plurality of computer rooms arranged in a shape of a chimney, in which the plurality of computer rooms are arranged to enclose a cavity that extends vertically and that is open upwards, and wherein the computer rooms have walls facing the cavity so as to delimit the cavity of the chimney, at least one or more of the walls comprising a ventilator fan, each ventilator fan arranged to allow air to move from an interior of the corresponding computer room to the cavity, the technical infrastructure further comprising at least one wall opening arranged to allow air to enter the interior of the technical infrastructure and, wherein, along an upward length of the chimney, the chimney cavity has a uniform cross-sectional area taken in a horizontal plane along a length of the cavity.

14. The infrastructure according to claim 13, further comprising data center equipment that generates heat within the computer rooms, the heat is evacuated through the ventilator fan for the corresponding computer room and up the cavity.

15. The technical infrastructure according to claim 13, wherein the uniform cross-sectional area is a polygon.

16. The technical infrastructure according to claim 13, wherein the technical infrastructure is capital infrastructure dedicated to and containing a computing/data center, hosting center, data backup site, a telecom/carrier hotel, or server farm.

* * * * *